United States Patent
Huang

(10) Patent No.: US 7,553,723 B2
(45) Date of Patent: Jun. 30, 2009

(54) MANUFACTURING METHOD OF A MEMORY DEVICE

(75) Inventor: Cheng-Chih Huang, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 11/752,177

(22) Filed: May 22, 2007

(65) Prior Publication Data

US 2008/0070373 A1   Mar. 20, 2008

(30) Foreign Application Priority Data

Sep. 20, 2006   (TW) ............................... 95134790 A

(51) Int. Cl.
*H01L 21/8242* (2006.01)
(52) U.S. Cl. .................. 438/246; 438/248; 438/389; 438/391; 438/738; 257/E21.653
(58) Field of Classification Search ................ 438/243, 438/248, 386, 391, 532, 246, 247, 389, 390, 438/524, 525, 738; 257/304, E21.653
See application file for complete search history.

(56) References Cited

U.S. PATENT DOCUMENTS

| | | | |
|---|---|---|---|
| 6,498,061 B2 * | 12/2002 | Divakaruni et al. | 438/243 |
| 6,573,137 B1 * | 6/2003 | Divakaruni et al. | 438/248 |
| 2004/0197988 A1 * | 10/2004 | Heineck et al. | 438/243 |

* cited by examiner

*Primary Examiner*—M. Wilczewski
*Assistant Examiner*—Toniae M Thomas
(74) *Attorney, Agent, or Firm*—Quintero Law Office

(57) ABSTRACT

A method of manufacturing a memory device. The memory device comprises a trench in a substrate, a capacitor at the low portion of the trench, a collar dielectric layer overlying the capacitor and covering a portion of the sidewall of the trench, and a conductive layer filling a portion of the trench over the capacitor. First, a first mask layer is formed on the conductive layer, wherein a bottom portion of the first mask layer is thicker than the side portion thereof in the trench. A second mask layer is formed on the first mask layer. Next, a portion of the second mask layer in the trench is ion implanted. The unimplanted portion of the second mask layer is removed.

11 Claims, 6 Drawing Sheets

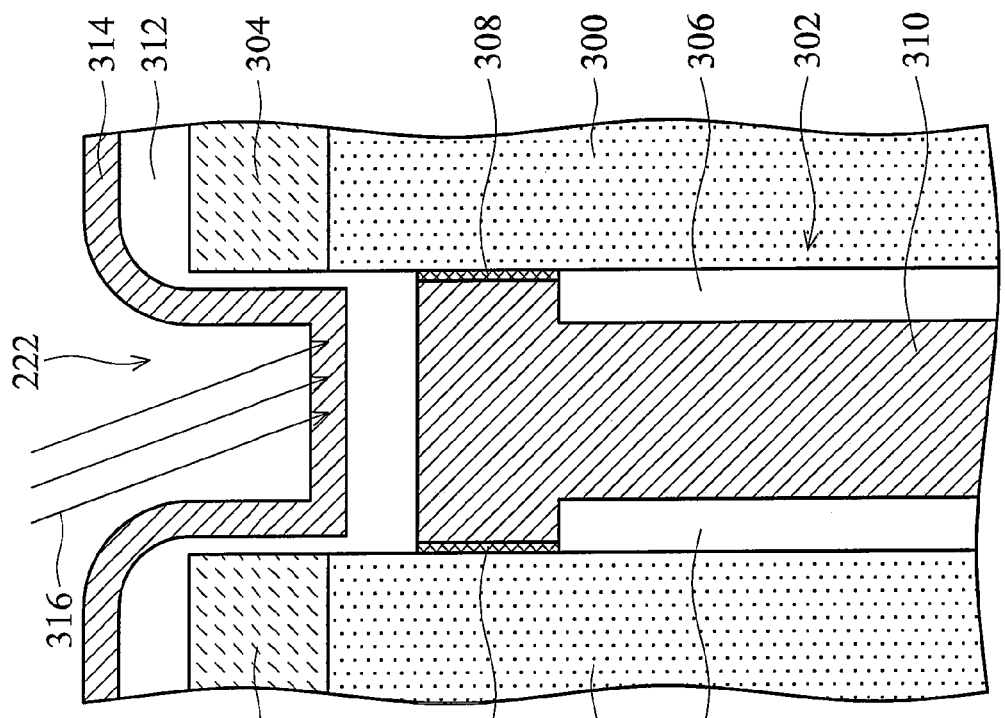
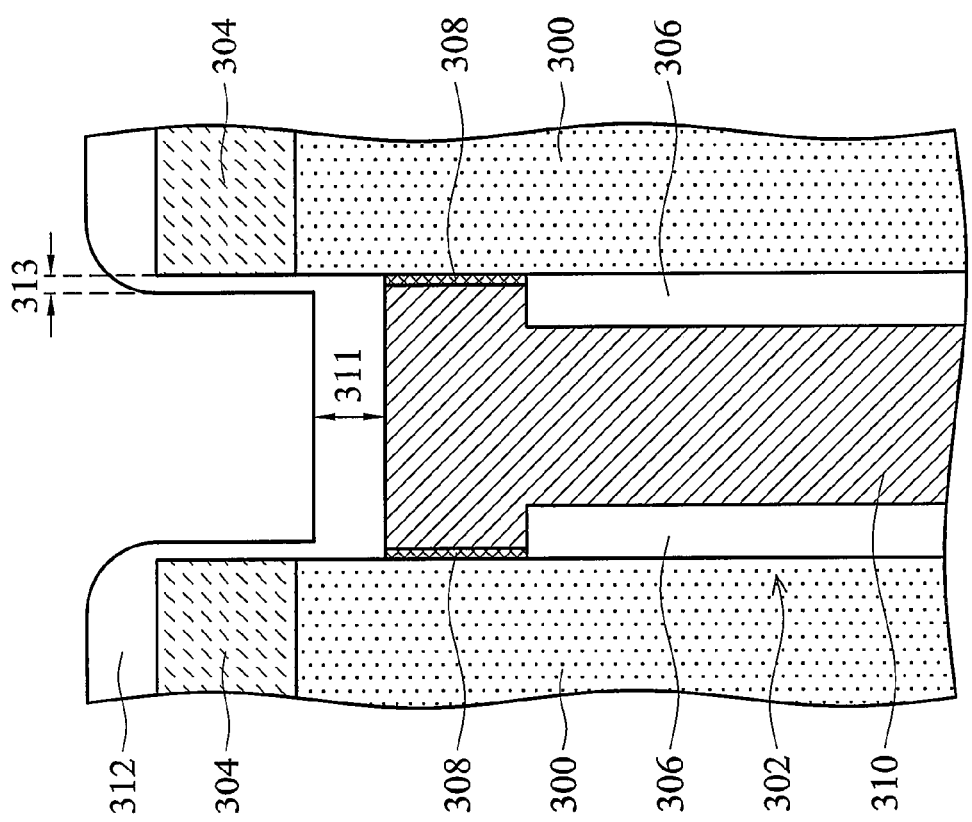
FIG. 3C
FIG. 3D

MANUFACTURING METHOD OF A MEMORY DEVICE

BACKGROUND OF THE INVENTION

1. Field of the Invention

The invention relates to a formation of semiconductor devices, and more particularly to a process for forming a memory device.

2. Description of the Related Art

DRAM (dynamic random access memory), an important semiconductor device, conventionally comprises a plurality of memory cells comprising a cell array and a peripheral circuit electrically connected to the cell array. The memory cell carries one transistor and one capacitor. DRAM stores data by the charging of the capacitor of the memory cell.

With such increased integration the size of the memory cell and the transistor must be reduced to yield DRAM with higher memory capacity and higher processing speed. A 3D capacitor structure can itself reduce occupied area in the semiconductor substrate, such that the 3D capacitor, such as a deep trench capacitor, is applied in fabrication of DRAM of 64 MB and more. Conventional DRAM, with plane transistor, covers more of the semiconductor substrate and cannot satisfy the demand for high integration. Therefore, vertical transistors occupying less space have gained popularity in memory cell fabrication. Further, the memory cells are arranged in a checkerboard configuration, applied to 0.11 μm semiconductor process technology.

FIG. 1 is a cross-section of a DRAM comprising memory cells with side buried region. Referring to FIG. 1, the memory cell 100 comprises a buried region 102 on one side and an isolation layer on the other side. Further, the memory cell 100 further comprises a transistor 104. However, since the memory cell is less than 0.09 μm, electric leakage or short circuit can occur in the memory cell opposite to the buried region 102.

BRIEF SUMMARY OF THE INVENTION

A detailed description is given in the following embodiments with reference to the accompanying drawings. These and other problems are generally solved or circumvented, and technical advantages are generally achieved, by preferred illustrative embodiments of the invention, which provide a display device.

A manufacturing method is provided for a memory device comprising a trench in a substrate, a capacitor at the low portion of the trench, a collar dielectric layer overlying the capacitor and covering a portion of the sidewall of the trench, a conductive layer filling a portion of the trench over the capacitor. First, a first mask layer is formed on the conductive layer, wherein bottom portion of the first mask layer is thicker than the trench side portions. A second mask layer is formed on the first mask layer. Next, a portion of the second mask layer in the trench is ion implanted. The unimplanted portions of the second mask layer are removed.

The provided method of manufacturing a memory device can protect the capacitor from electrical leakage and short circuit.

BRIEF DESCRIPTION OF THE DRAWINGS

The invention can be more fully understood by reading the subsequent detailed description and examples with references made to the accompanying drawings, wherein:

FIGS. 3A~3F are cross-sections of a fabrication process of an embodiment of the invention.

DETAILED DESCRIPTION OF THE INVENTION

Figure 1:
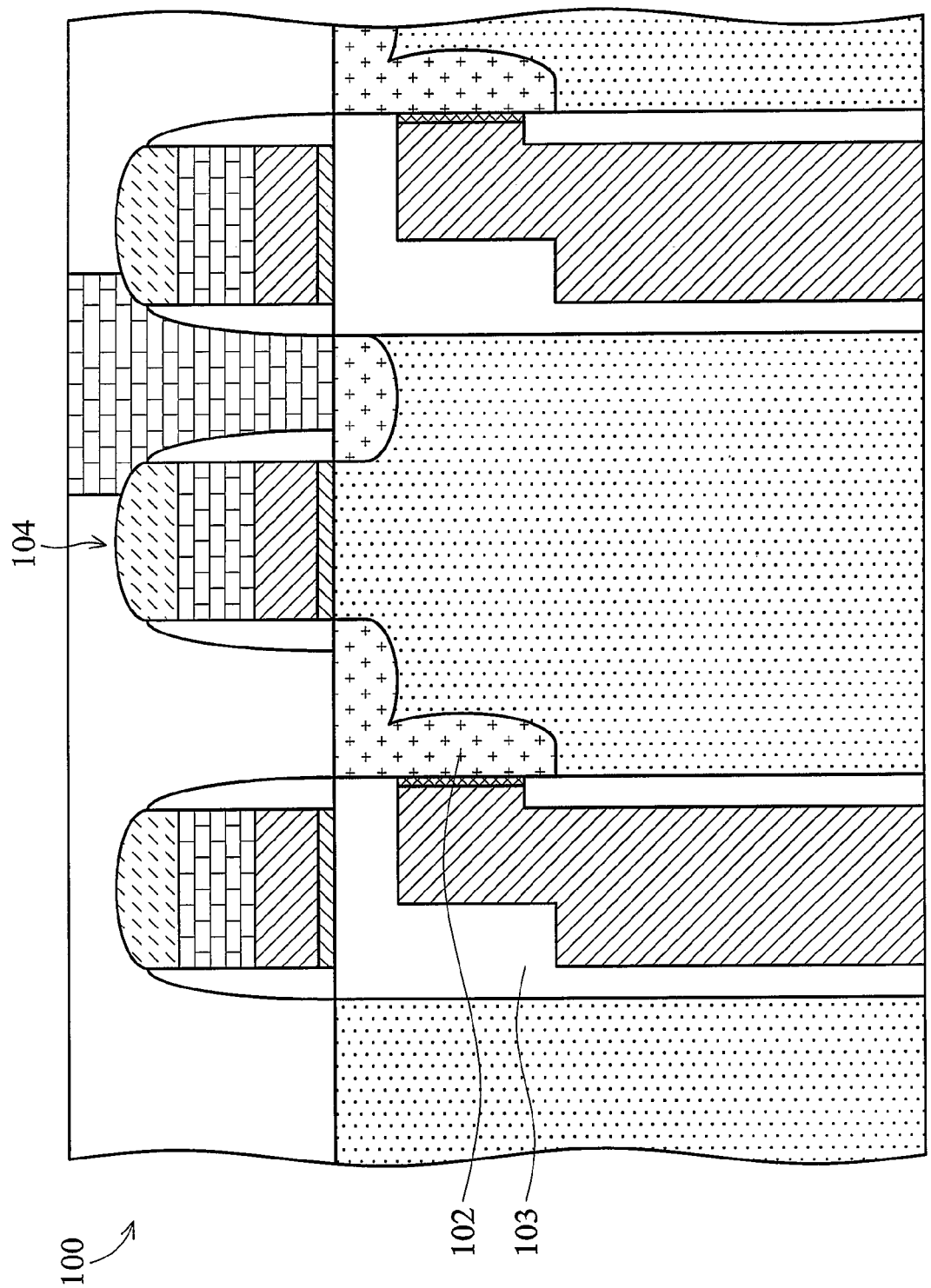
FIG. 1 is cross-section of a memory cell of a conventional DRAM.

The following description is of the best-contemplated mode of carrying out the invention. This description is made for the purpose of illustrating the general principles of the invention and should not be taken in a limiting sense. The scope of the invention is best determined by reference to the appended claims. Embodiments of the invention, which provides a liquid crystal display device, will be described in greater detail by referring to the drawings that accompany the invention. It is noted that in the accompanying drawings, like and/or corresponding elements are referred to by like reference numerals.

FIGS. 2A to 2D are cross-sections of a method of forming a memory device comprising a capacitor with side buried layer of a comparative embodiment known to the applicants (not prior art), to illustrate problems discovered by the applicants.

Figures 2A, 2B:
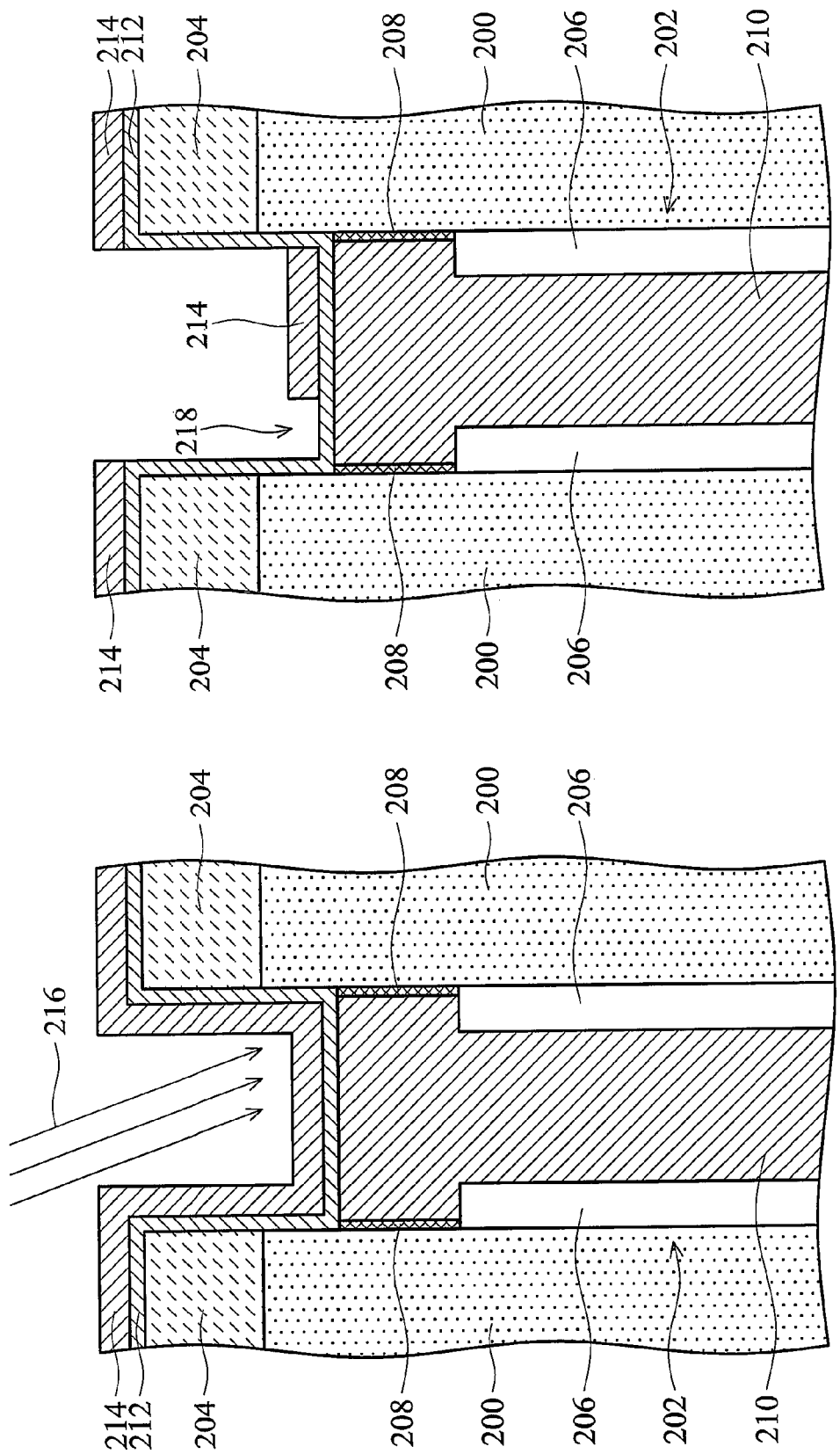
FIGS. 2A~2D are cross-sections of a fabrication process of a comparative embodiment of the invention.

Referring to FIG. 2A, a substrate 200 is provided comprising a trench 202, wherein the trench is formed by etching the substrate 200 with a pad nitride layer 204 as etching mask. Next, a trench capacitor (not shown) is formed on the bottom of the trench 202. Next, a collar dielectric layer 206 is formed on the sidewalls of the trench above the trench capacitor. Next, an interface layer 208 is formed on the sidewalls of the trench 202 above the collar dielectric layer 206.

Next, a conductive layer 210 is blanketly formed to fill the trench, and the conductive layer 210 and the interface layer 208 are etched back to reduce the thickness of the conductive layer 210. Next, a silicon nitride layer 212 and a poly-silicon layer 214 are formed on the conductive layer 210 and pad nitride layer 204 within the trench 202. Next, an ion implantation 216 with BF2 as source is performed on a part of the poly-silicon layer 214 at a specific angle, resulting in alteration of etching characteristics of the implanted poly-silicon layer 214.

Referring to FIG. 2B, the substrate is fully immersed in $NH_4OH$ serving as an etchant. Since the unimplanted poly-silicon layer has an etching rate exceeding that of the implanted poly-silicon layer, the unimplanted poly-silicon layer is removed by NH4OH, exposing an opening 218 and leaving the implanted poly-silicon layer 214.

Figure 2D:
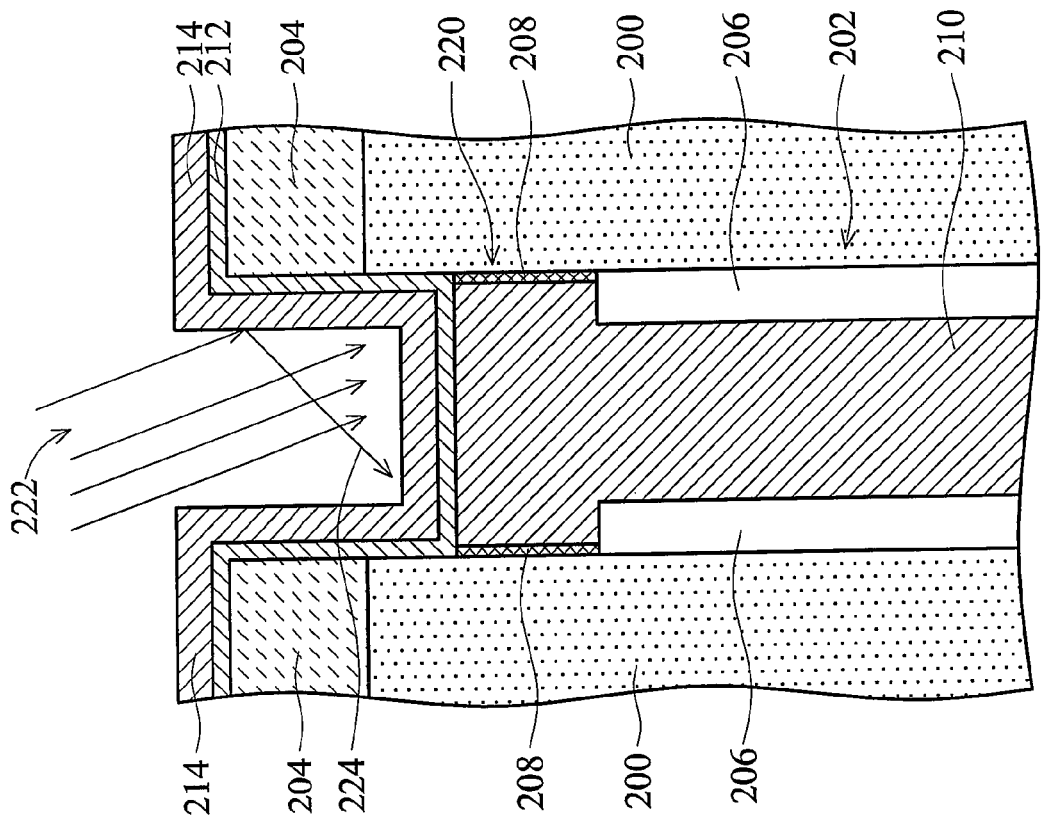
Figure 2C:
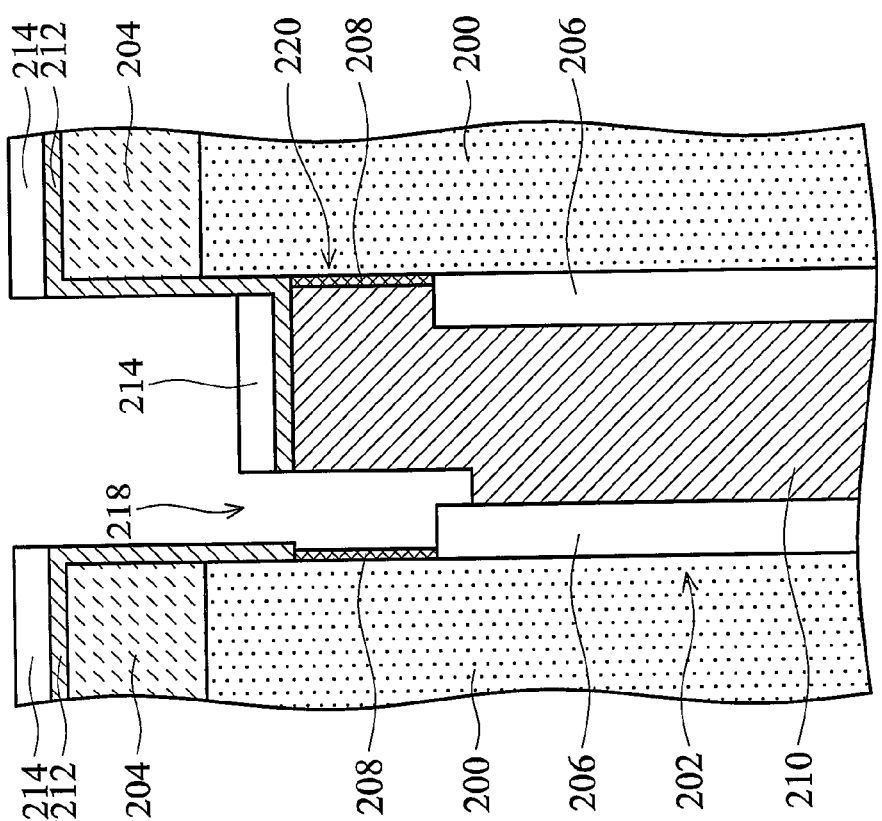

Next, referring to FIG. 2C, the remaining poly-silicon layer 214 disposed on the nitride layer 212 is subjected to a thermal oxidation to form an oxide layer. Next, the nitride layer 212, and the conductive layer 210 disposed on one side of the upper trench are etched with the oxide layer serving as mask. Finally, a dielectric layer is filled into the opening 218, with the interface layer 208 opposite to the opening serving as a buried layer 220. When the gate line is narrower than 0.9 μm, the fabricating method can result in problems as follows.

Referring to FIG. 2D, as the opening of the trench narrows and the aspect ratio of the trench increases, for example if opening width is less than 0.09 μm and the aspect ratio exceeds 4, implanted ions 224 applied to the poly-silicon layer 214, during ion implantation 222, rebound off one side of the poly-silicon layer 214 to the opposite side. The poly-silicon layer 214 around the trench is thus completely implanted, such that no poly-silicon layer 214 is removed by subsequent etching. Thus, the structure shown in FIG. 2C cannot be obtained.

Embodiments of the invention, which provides a method for forming a semiconductor device, are described in greater detail by referring to the drawings accompanying the disclosure. It is noted that in the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

Figures 3A, 3B:
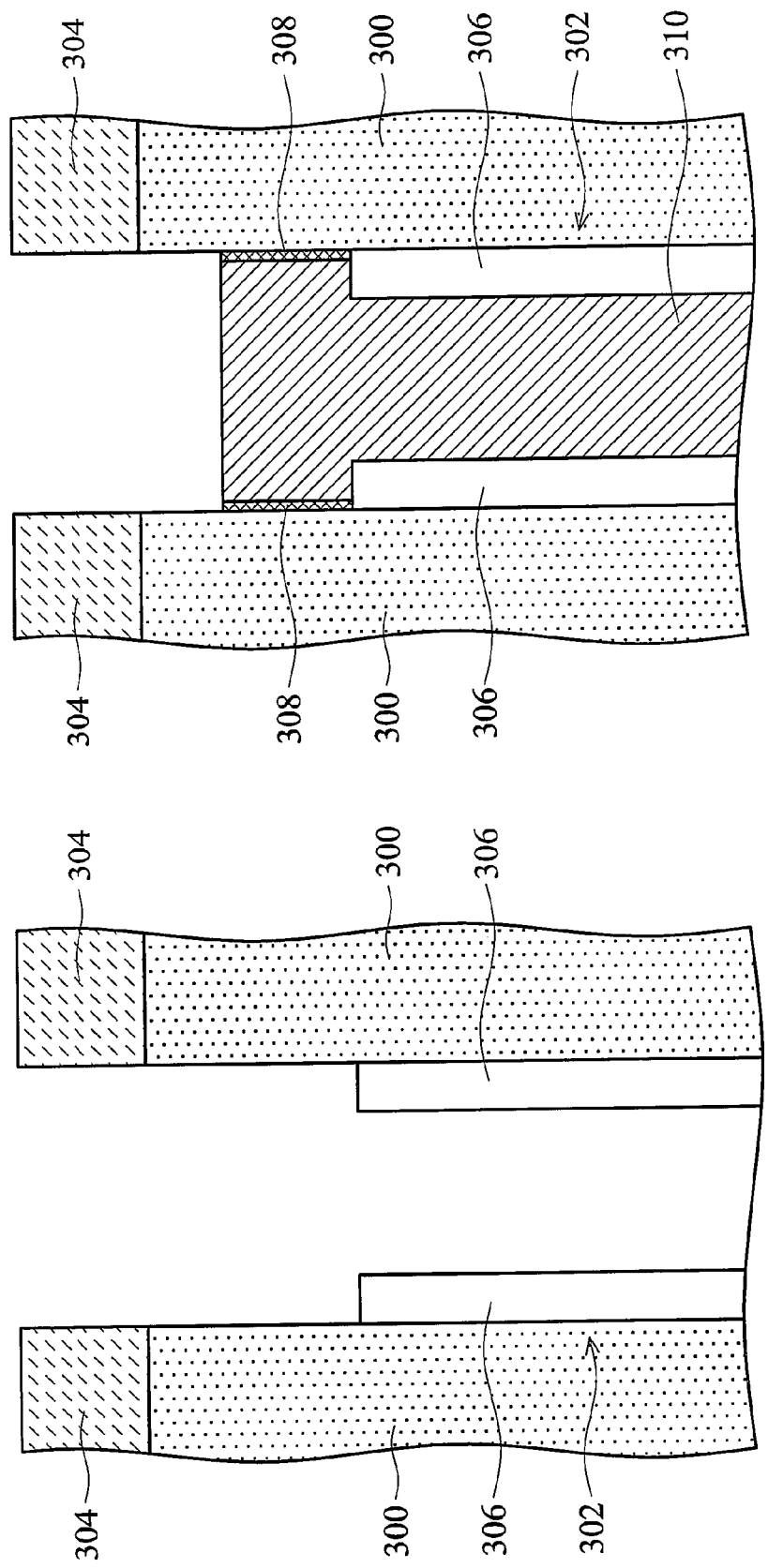

FIGS. 3A~3F illustrate process steps for forming a trench memory device with a buried layer of an embodiment of the invention. Referring to FIG. 3A, a substrate 300 with a trench 302 is provided wherein the trench is formed by etching the substrate 200 with a pad nitride layer as etching mask.

The substrate 300 may comprise silicon, gallium arsenide, gallium nitride, strained silicon, silicon germanium, silicon carbide, diamond, an epitaxy layer, and/or other materials.

Next, a trench capacitor (not shown) is formed on the bottom of the trench 302. Next, a collar dielectric layer 306 is formed on the sidewalls of the trench above the trench capacitor. Next, referring to FIG. 3B, an interface layer 308 is formed on the sidewalls of the trench 302 above the collar dielectric layer 306, wherein the collar dielectric layer can be silicon oxide, silicon nitride, silicon nitrogen oxide, or combinations thereof. The interface layer 308 can be silicon nitride or silicon nitride with a thickness of 0.3 Å~50Å. The interface layer 308 further comprises a layer by oxidizing or nitridizing the side walls of the trench 302 above the collar dielectric layer 306.

Next, a conductive layer 310 is blanketly formed to fill the trench, and the conductive layer 310 and the interface layer 308 are etched back to reduce the thickness of the conductive layer 310. In one embodiment of the invention, the top surface of the etched conductive layer 310 is lower than the top surface of the substrate 300. The deposition process can be chemical vapor deposition (CVD), physical vapor deposition (PVD), plasma enhanced chemical vapor deposition (PECVD), atomic layer deposition (ALD), and the like. Next, referring to FIG. 3C, a first mask layer 312 is formed on the sidewalls of the trench, the conductive layer 310, and the pad layer 304, wherein the bottom portion of the first mask layer is thicker than the side portion thereof in the trench. The first mask layer comprises oxide layer, nitride layer, nitrogen oxide layer, or combinations thereof.

In an embodiment of the invention, the first mask layer 312 is formed by high density plasma, such as electron cyclotron resonance high density plasma, helicon high density plasma, or inductive coupled plasma high density plasma. Since the first mask layer 312 is formed by high density plasma, the bottom portion of the first mask layer is thicker than the side portion thereof in the trench.

It should be noted that the thickness ratio between the bottom and side portions of the first mask layer 312 can be adjusted by modifying the ion density and power of the high density plasma. Referring to FIG. 3C, since the side portion of the first mask layer is thinner than that of the bottom portion thereof, the aspect ratio of the opening 222 within the trench is reduced.

Next, referring to FIG. 3D, a second mask layer 314 is formed on the first layer of the first mask layer 312, wherein the etching characteristic of the second mask layer 314 can be modified by implantation thereof. In an embodiment of the invention, the second mask layer 314 can be a poly-silicon layer. Next, an implantation 316 of B or As ions is performed on a part of the second mask layer 314 at a specific angle, resulting in alteration of etching characteristics of the implanted second mask layer 314. It should be noted that the specific angle and power of the ion implantation can be modified depending on the requirements of the memory device.

Referring to FIG. 3D, since the ion implantation 316 is performed at a specific angle on the second mask layer, a part of the second mask layer is unimplanted. Further, since the bottom portion thickness of the first mask layer 312 exceeds the side portion thickness of the first mask layer 312, the aspect ratio of the opening 222 within the trench is reduced. Therefore, the method provided prevents the second mask layer 314 (poly-silicon layer) from complete implantation due to the high aspect ratio of the opening 222 in the comparative embodiment.

Figure 3F:
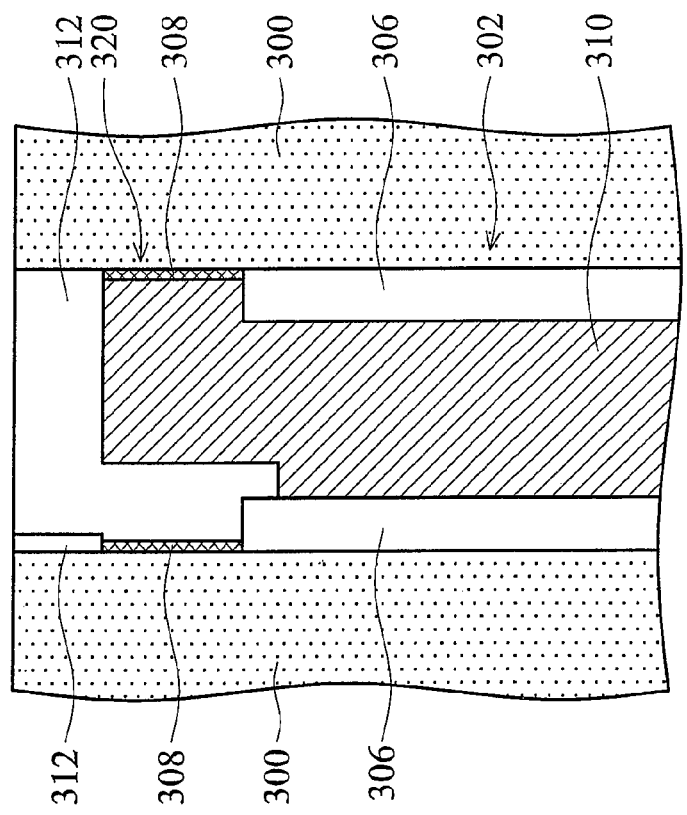
Figure 3E:
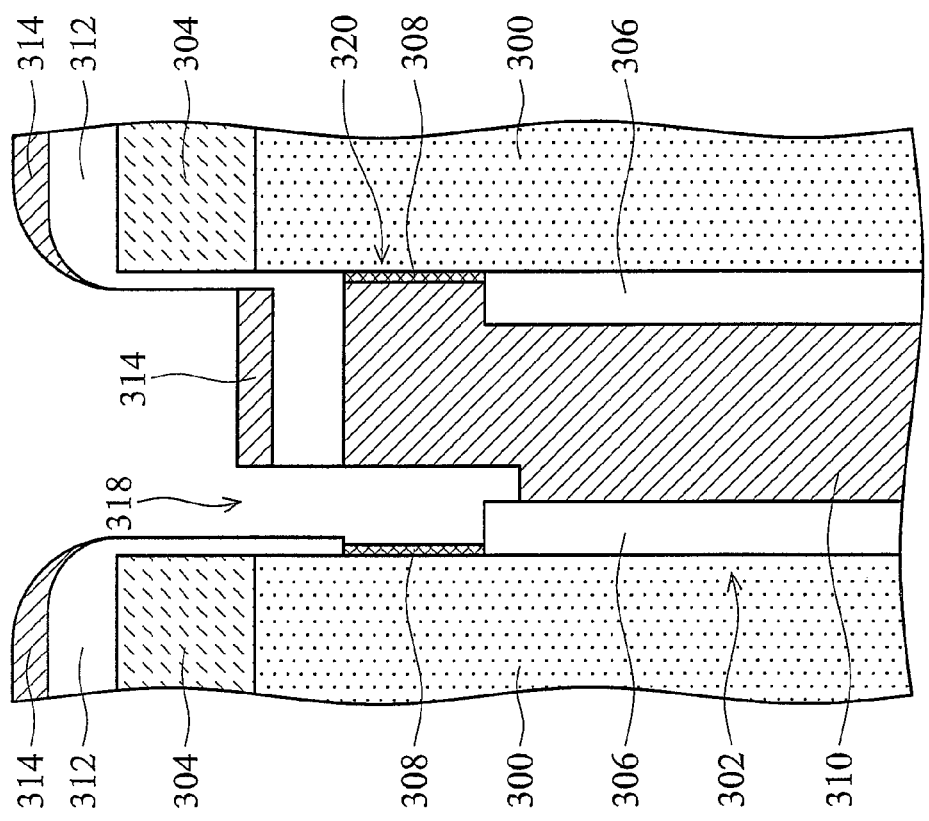

Next, referring to FIG. 3E, the substrate is fully immersed in $NH_4OH$ serving as etchant. Since the unimplanted second mask layer has an etching rate exceeding that of the implanted second mask layer, the unimplanted second mask (poly-silicon) layer is removed by $NH_4OH$, exposing an opening 318.

Next, the first mask layer 312, the conductive layer 310, and the collar dielectric layer disposed on one side of the upper trench are etched by dry etching with the implanted second mask layer serving as mask.

Next, referring to FIG. 3F, the second mask layer 314, the first mask layer 312, and the pad layer 304 are removed by an isotropic etching (isotropic dry or wet etching). Next, a dielectric layer is formed into the trench 302 filling the opening after removing the second mask layer 314, and conductive layer 310 by an isotropic etching. Moreover, the interface layer 308 opposite to the opening serves as a buried layer 320.

In some embodiments of the invention, referring to FIG. 3E, since the bottom portion thickness of the first mask layer 312 exceeds the side portion thickness of the first mask layer 312, the aspect ratio of the opening 222 within the trench is reduced. Due to the reduced aspect ratio of the opening 222, the implanted ions can be directly shot to the bottom of the second mask layer 314, with no rebound from the sidewall of the second mask layer, preventing implantation of the second mask layer. The method disclosed can be used in 0.09 μm semiconductor process technology and adapted to solve electrical leakage and short circuit issues.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of manufacturing a memory device comprising a trench in a substrate, a capacitor at the low portion of the trench, a collar dielectric layer overlaying the capacitor and covering a portion of the sidewall of the trench, and a conductive layer filling a portion of the trench over the capacitor, the method comprising:

forming a first mask layer on the conductive layer, wherein the bottom portion of the first mask layer is thicker than the side portion thereof in the trench, resulting in the aspect ratio of an opening surrounded by the first mask layer being reduced; forming a second mask layer on the first mask layer; subjecting the second mask layer within the trench to an ion implantation; and removing the unimplanted portion of the second mask layer.

2. The method of manufacturing a memory device as claimed in claim 1, further comprising:
   forming a interface layer by oxidizing or nitridizing the sidewalls of the trench above the collar dielectric layer.

3. The method of manufacturing a memory device as claimed in claim 1, wherein the first mask layer comprises oxide layer, nitride layer, nitrogen oxide layer, or combinations thereof.

4. The method of manufacturing a memory device as claimed in claim 1, wherein the first mask layer is formed by high density plasma.

5. The method of manufacturing a memory device as claimed in claim 1, wherein the implanted second mask layer has etching characteristics differing from those of the unimplanted second mask layer.

6. The method of manufacturing a memory device as claimed in claim 1, wherein the second mask layer is a polysilicon layer.

7. The method of manufacturing a memory device as claimed in claim 1, wherein the unimplanted second mask layer is removed by etching with NH4OH.

8. The method of manufacturing a memory device as claimed in claim 1, further comprising etching the first mask layer, the conductive layer, and the collar dielectric layer disposed on one side of the upper trench, by dry etching with the second mask layer serving as etching mask, to form an opening.

9. The method of manufacturing a memory device as claimed in claim 8, further comprising forming a dielectric layer in the trench to fill the opening after removing the second mask layer by isotropic etching.

10. The method of manufacturing a memory device as claimed in claim 1, wherein the ion implantation is a As-ion or B-ion implantation.

11. A method of manufacturing a memory device comprising:
   sequentially forming a trench in a substrate, a capacitor at the low portion of the trench, a collar dielectric layer overlying the capacitor and covering a portion of the sidewall of the trench, and a conductive layer filling a portion of the trench over the capacitor;
   forming a first mask layer on the conductive layer, wherein a bottom portion of the first mask layer is thicker than a side portion thereof in the trench, to an aspect ratio of the trench covered by the first mask layer being reduced;
   forming a second mask layer on the first mask layer;
   subjecting the second mask layer within the trench to an ion implantation; and removing the unimplanted portion of the second mask layer.

* * * * *